United States Patent
Mathai et al.

(10) Patent No.: US 10,050,414 B2
(45) Date of Patent: Aug. 14, 2018

(54) MONOLITHIC WDM VCSEL ARRAYS BY QUANTUM WELL INTERMIXING

(71) Applicant: HEWLETT PACKARD ENTERPRISE DEVELOPMENT LP, Houston, TX (US)

(72) Inventors: Sagi Varghese Mathai, Palo Alto, CA (US); Michael Renne Ty Tan, Menlo Park, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/543,233

(22) PCT Filed: Jan. 22, 2015

(86) PCT No.: PCT/US2015/012357
§ 371 (c)(1),
(2) Date: Jul. 12, 2017

(87) PCT Pub. No.: WO2016/118132
PCT Pub. Date: Jul. 28, 2016

(65) Prior Publication Data
US 2018/0034242 A1    Feb. 1, 2018

(51) Int. Cl.
*H01S 5/00* (2006.01)
*H01S 5/34* (2006.01)
(Continued)

(52) U.S. Cl.
CPC .......... *H01S 5/3414* (2013.01); *H01S 5/3413* (2013.01); *H01S 5/4087* (2013.01);
(Continued)

(58) Field of Classification Search
CPC .. H01S 5/3414; H01S 5/3413; H01S 5/34313; H01S 5/34326; H01S 5/34333;
(Continued)

(56) References Cited

U.S. PATENT DOCUMENTS 6,259,121 B1* 7/2001 Lemoff .................. H01S 5/423
257/14
6,936,839 B2    8/2005 Taylor
(Continued)

FOREIGN PATENT DOCUMENTS

EP          1364392 A2     11/2003
WO     WO-200157565 A1     8/2001

OTHER PUBLICATIONS

Herbert L., "Quantum Well Intermixing for Photonic IC Applications," (Research Paper), proceedings of SPIE 3491, Dec. 4, 1998, vol. 3491, available at http://proceedings.spiedigitallibrary.org/proceeding.aspx?arcticle=962834.

(Continued)

*Primary Examiner* — Kinam Park
(74) *Attorney, Agent, or Firm* — Hewlett Packard Enterprise Patent Department

(57) ABSTRACT

An array of monolithic wavelength division multiplexed (WDM) vertical cavity surface emitting lasers (VCSELs) is provided with quantum well intermixing. Each VCSEL includes a bottom distributed Bragg reflector (DBR), an upper distributed Bragg reflector, and a laser cavity therebetween. The laser cavity includes a multiple quantum well (MQW) layer sandwiched between a lower separate confinement heterostructure (SCH) and an upper SCH layer. Each MQW region experiences a different amount of quantum well intermixing and concomitantly a different lasing wavelength shift.

15 Claims, 7 Drawing Sheets

(51) Int. Cl.
*H01S 5/40* (2006.01)
*H01S 5/42* (2006.01)
*H01S 5/343* (2006.01)

(52) U.S. Cl.
CPC .............. *H01S 5/423* (2013.01); *H01S 5/343* (2013.01); *H01S 5/34313* (2013.01); *H01S 5/34326* (2013.01); *H01S 5/34333* (2013.01); *H01S 5/42* (2013.01)

(58) Field of Classification Search
CPC . H01S 5/343; H01S 5/423; H01S 5/42; H01S 5/4087
See application file for complete search history.

(56) References Cited

U.S. PATENT DOCUMENTS

| | | | |
|---|---|---|---|
| 6,937,633 B2 | 8/2005 | Chua et al. | |
| 7,190,861 B2 | 3/2007 | Knopp et al. | |
| 8,687,665 B1 | 4/2014 | Tauke-Pedretti et al. | |
| 2002/0105991 A1* | 8/2002 | Coldren | B82Y 20/00 372/50.1 |
| 2002/0131668 A1* | 9/2002 | Marsh | B82Y 20/00 385/14 |
| 2003/0085409 A1 | 5/2003 | Shen et al. | |
| 2003/0141511 A1* | 7/2003 | Marsh | B82Y 20/00 257/98 |
| 2004/0161006 A1* | 8/2004 | Chang | B82Y 20/00 372/45.011 |
| 2005/0063044 A1* | 3/2005 | Michie | H01S 5/50 359/344 |
| 2009/0086784 A1* | 4/2009 | Li | B82Y 20/00 372/50.11 |
| 2012/0093189 A1 | 4/2012 | Fattal et al. | |

OTHER PUBLICATIONS

International Search Report & Written Opinion received in PCT Application No. PCT/US2015/012357, dated Oct. 19, 2015, 11 pages.

May-Arrioja, D. et al., "Intermixing of NP-based Multiple Quantum wells for Integrated Optoelectronic Devices," (Research Paper), proceedings of ACM, Mar. 2009, vol. 40, No. 3 pp. 574-576 available at http://dl acm org/citation cfm?id=1514823.

Ryan L. et al., "Interdiffused Quantum Wells for Lateral Carrier Confinement in VCSELs," (Research Paper), proceedings of IEEE, Jul.-Aug. 1998, pp. 706-714, available at http://ieeexplore ieee org/stamp/stamp jsp?arnumber=720483.

* cited by examiner

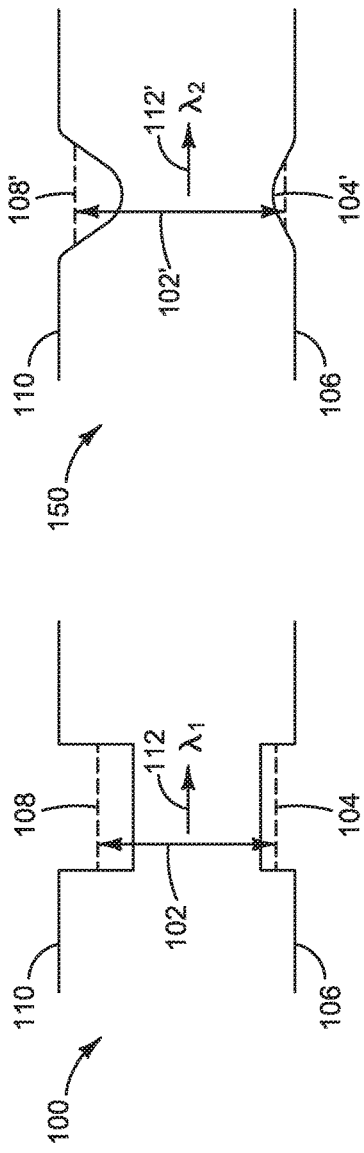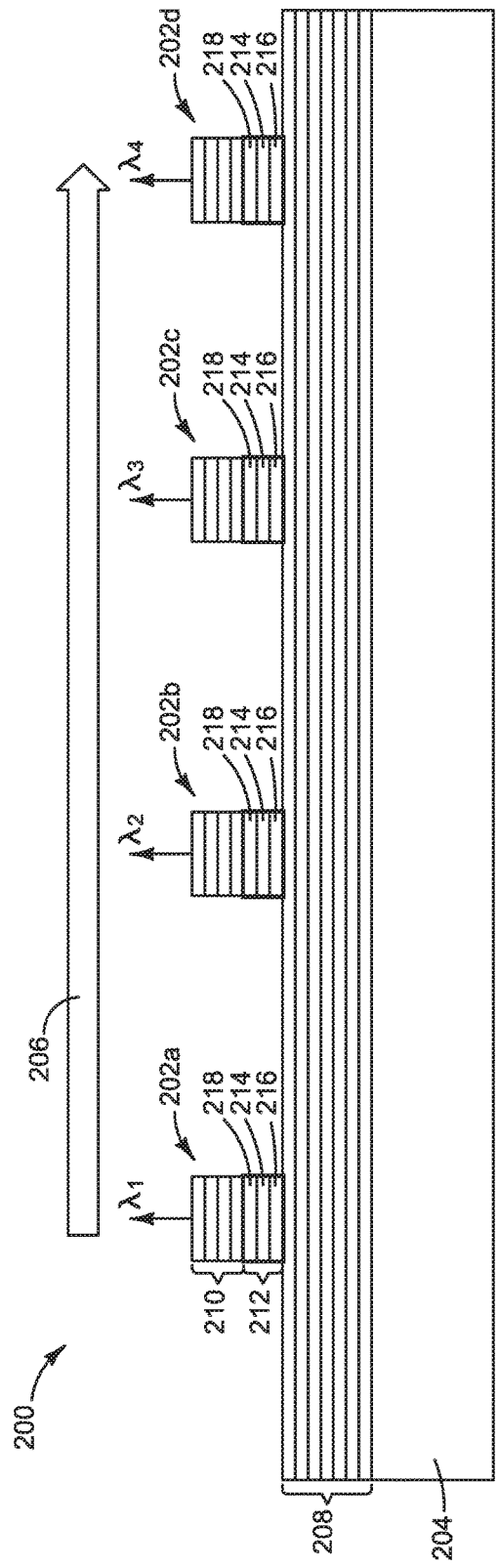

MONOLITHIC WDM VCSEL ARRAYS BY QUANTUM WELL INTERMIXING

BACKGROUND

A datacenter is a facility used to house computer systems and associated components, such as telecommunications and storage systems. To handle increasing volumes of data, optical fiber is replacing copper wire. A major disadvantage of copper is the power consumption of transceivers. Due to the digital processing needed to make a copper solution work, a copper transceiver may consume up to 5-6 W of power. This is almost ten times as much as a fiber optic transceiver that consumes only 0.5-1 W.

VCSELs (Vertical Cavity Surface Emitting Lasers) are a type of semiconductor laser diode with laser beam emission perpendicular from the wafer surface, contrary to conventional edge-emitting semiconductor lasers (also in-plane lasers) which emit from surfaces formed by cleaving the individual chip out of a wafer. VCSELs may be used as a light source for optical fiber data transmission.

BRIEF DESCRIPTION OF THE DRAWINGS

FIGS. 1A-1B depict a schematic view of quantum well intermixing (QWI) band diagrams for both an as-grown VCSEL band (FIG. 1A) and a post-QWI VCSEL band (FIG. 1B), according to an example.

FIG. 2 is a side elevation view, depicting monolithic WDM (Wave-length Division Multiplexing) VCSELs with a spatially varying gain peak, according to an example.

DETAILED DESCRIPTION

Figure 3A:
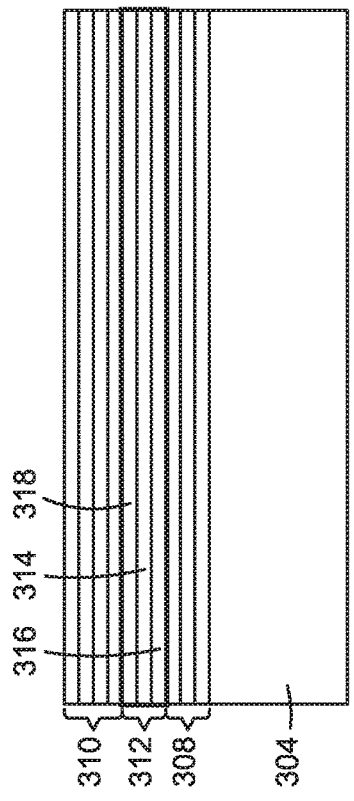
FIGS. 3A-3D depict a process flow for manufacturing the device shown in FIG. 2.

In the following description, numerous details are set forth to provide an understanding of the examples disclosed herein. However, it will be understood that the examples may be practiced without these details. While a limited number of examples have been disclosed, it should be understood that there are numerous modifications and variations therefrom.

As used in the specification and claims herein, the singular forms "a," "an" and "the" include plural referents unless the context clearly dictates otherwise.

As used in this specification and the appended claims, "approximately" and "about" mean a ±10% variance caused by, for example, variations in manufacturing processes.

In the following detailed description, reference is made to the drawings accompanying this disclosure, which illustrate specific examples in which this disclosure may be practiced. The components of the examples can be positioned a number of different orientations and any directional terminology used in relation to the orientation of the components is used for purposes of illustration and is in way limiting. Directional terminology includes words such as "top," "bottom," "front," "back," "leading," "trailing," etc. Similar or equal elements in the Figures may be indicated using the same numeral.

It is to be understood that other examples in which this disclosure may be practiced exist, and structural or logical changes may be made without departing from the scope of the present disclosure. Therefore, the following detailed description is not to be taken in a limiting sense. Instead, the scope of the present disclosure is defined by the appended claims. While a limited number of examples have been disclosed, it should be understood that there are numerous modifications and variations therefrom.

Once an optical fiber infrastructure is installed in datacenters, it is a daunting task to add more fibers to accommodate increasing bandwidth demands. Wavelength division multiplexing (WDM) is a means to increase the bandwidth density without increasing fiber count. Typical VCSEL based WDM transmitters are composed of discrete VCSEL dies emitting light at unique wavelengths. This may translate to increased transmitter packaging complexity and cost.

There have been many attempts at prior solutions. One attempted solution has induced a thermal gradient across the wafer to cause non-uniform epitaxial growth. However, this requires precise control of the temperature distribution of the wafer pockets in MBE or MOCVD reactors.

Another attempted solution has employed selective area growth. However, this is heavily dependent on surface patterning and conditions prior to gain material growth.

Yet another attempted solution has employed a partial VCSEL structure growth followed by oxidation and selective etching. However, this does not address gain peak tuning and requires multiple oxidation/etching steps.

Still another attempted solution has involved growing multiple gain regions, etching channels to expose each gain region, bonding the wafer to a second substrate with DBRs (Distributed Bragg Reflectors). However, the bonding between planar and non-planar wafer will impact yield.

In accordance with the teachings herein, monolithic WDM VCSEL arrays may use quantum well intermixing (QWI). Each VCSEL may include a bottom distributed Bragg reflector (DBR), an upper distributed Bragg reflector, and a laser cavity therebetween. The laser cavity may include a multiple quantum well (MQW) layer sandwiched between a lower separate confinement heterostructure (SCH) layer and an upper SCH layer. The multiple quantum well layer is made of alternating quantum well and barrier layers. Each VCSEL experiences a different amount of quantum intermixing and concomitantly a different lasing wavelength shift.

While the QWI may not need to be impurity-free, the presence of impurities may lead to reliability issues, increased optical loss, and compromise VCSEL performance. QWI enables spatially tuning of the gain peak across the VCSEL array, so that each VCSEL or sets of VCSELs emit light at discrete wavelengths.

The teachings herein have the potential to more efficiently utilize datacenter optical fiber infrastructure, increase the bandwidth density of bundled optical connections, and reduce the packaging cost and complexity of VCSEL based WDM transmitters.

Impurity free quantum well intermixing allows blueshifting the emission wavelength of quantum well gain media in VCSELs without creating unwanted defects that can lead to high optical loss, performance, and reliability concerns.

A method of manufacturing an array of monolithic WDM VCSELs with QWI is provided. Each VCSEL may include a multiple quantum well and emitting light at a different wavelength from the others. The method may include creating point defects, such as vacancies, above the multiple quantum well layer, wherein different concentrations of point defects induce different amounts of intermixing between the quantum well and barrier materials and different wavelengths of light.

The basic construction and process flow is as follows:
grow a lower contact layer DBR, laser cavity, and quantum wells, and a sacrificial cap layer;
selectively intermix the quantum wells (using rapid thermal annealing) in regions where a blue shift is desired by covering those areas with a stress-inducing layer;
strip off the stress-inducing and cap layers, prepare the surface for regrowth, and grow the upper VCSEL layers; and
fabricate the VCSEL arrays.

A linear array of VCSELs may be fabricated, each VCSEL in the array emitting a different wavelength. Alternatively, the VCSELs may be arranged in two-dimensional arrays where each row emits a specific wavelength.

The VCSELs may be fabricated as top emitters or substrate side emitters and patterned with under bump metals and/or solder bumps for direct solder attachment to interposers, organic substrates, or PCBs.

FIGS. 1A-1B are each a schematic view of the energy band diagrams 100, 150 of a quantum well gain medium, in an as-grown state (FIG. 1A) and after quantum well intermixing (FIG. 1B). In FIG. 1A, there is a distance, denoted by arrow 102, separating a hole energy level 104 in valence band 106 from an electron energy level 108 in conduction band 110. Light $\lambda_1$, denoted by arrow 112, is at a longer wavelength and is termed "red".

In FIG. 1B, after quantum well intermixing, the distance 102' between the hole energy level 104' and the electron energy level 108' may be increased by quantum well intermixing, as describe in greater detail below. Light $\lambda_2$, denoted by arrow 112', is at a shorter wavelength and is termed 'blue' or "blue-shifted".

FIGS. 1A-1B may be viewed as showing the energy band diagrams of two VCSELs gain media side by side, one in which no QWI has taken place and one in which QWI has taken place. By controlling the extent of QWI, more VCSELs may be placed side by side, each VCSEL emitting a different wavelength of light. The VCSEL gain media may incorporate multiple quantum wells. In this case, QWI will shift the gain peak of each quantum well in the gain media.

FIG. 2 is a side elevational view of a configuration, or array, 200 of four VCSELs 202a, 202b, 202c, 202d, having been processed so that there is an increasing blue shift going from left to right of the Figure. Each VCSEL 202a, 202b, 202c, 202d is supported on a common substrate 204 and emits a different wavelength of light $\lambda_1$, $\lambda_2$, $\lambda_3$, $\lambda_4$, respectively. As shown by arrow 206, the array 200 has a spatially increasing blue shift. As pictured, the array 200 may be a one-dimensional array of four VCSELs. Alternatively, the array 200 may be a row of four VCSELs in a two-dimensional array of VCSELs. While FIG. 2 depicts an array of four VCSELs, there may be fewer or more VCSELs in the array 200.

Each VCSEL 202a-202d may include a lower distributed Bragg reflector 208 (common to all VCSELs), an upper distributed Bragg reflector 210, and a cavity 212 therebetween. The cavity 212 in each case may include a multiple quantum well (MQW) layer 214 sandwiched between a lower separate confinement heterostructure (SCH) layer 216 and an upper SCH layer 218. The substrate 204 may be GaAs. The lower and upper DBRs 208, 210 may be formed of alternating layers of, but not limited to, GaAs and AlGaAs. The lower and upper SCH layers 216, 218 may be AlGaAs. The MQW 214 may be alternating layers (not shown) of, but not limited to, GaAs and AlGaAs. It will be appreciated that various compositions of $Al_xGa_{1-x}As$, where x=0 to 1, may be employed, since all such compositions are lattice-matched to GaAs. Alternative materials may be employed in the MQW such as InGaAs and InGaP and GaAsP.

Since the variation in wavelength progresses in a orderly fashion from the spaced-apart VCSELs, this configuration 200 is called "monolithic WDM VCSELs with spatially varying gain peak". The configuration 200 is considered to be monolithic, since all VCSELs have essentially the same structure, but for the amount of intermixing in the MQW. The point defects to induce intermixing may be introduced by creating a stress mismatch on a surface of the cap layers and propagating the point defects toward the MQW.

The array 200 is considered to be wavelength division multiplexing because of the different wavelengths emitted by the array of VCSELs.

FIGS. 3A-3D illustrate are example method for manufacturing an array of VCSELs. In this example, an array 300 of two VCSELs 302a, 302b is formed. It may be appreciated that more than two VCSELs may be made by this method.

The method starts with providing a substrate 304, as shown in FIG. 3A. The lower DBR 308 is formed on the top of the substrate. The lower SCH layer 312, the quantum wells for the MQW 314, and the upper confinement layer 318 may each be formed in turn over the lower DBR 308. A sacrificial cap layer 320 may be formed on the top of the upper SCH layer 318. The sacrificial cap layer 320 may be of GaAs, and may be removed in a later stage of the method. The thickness of the sacrificial cap layer 320 may be in the range of about 10 to 200 nm. In other approaches, the upper SCH layer 318 may be replaced with a thin etch stop layer, such as but not limited to AlAs, AlGaAs, InGaP, and capped with a GaAs sacrificial cap layer 320.

Figure 3C:
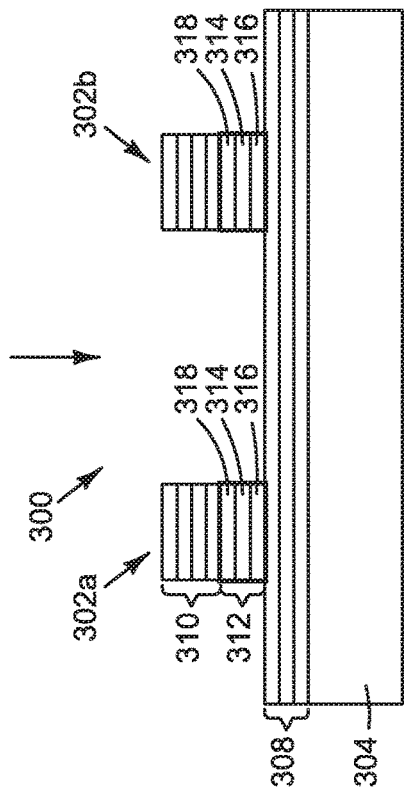
Figure 3B:
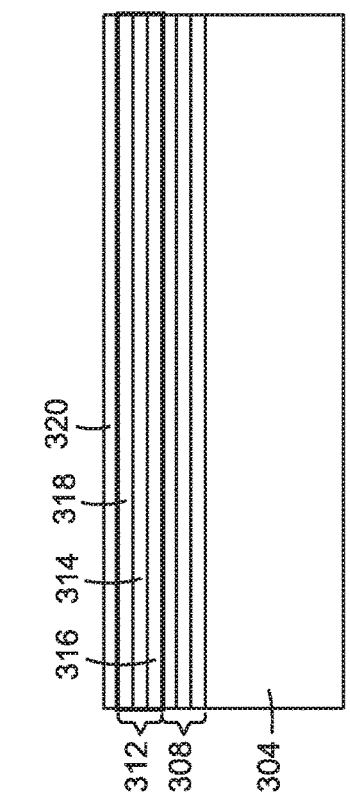

In FIG. 3B, selectively intermixing the quantum wells may be achieved by covering those areas 320a with a stress-inducing layer 322 where a blue shift is desired. The thickness of the stress-inducing layer 322 may be in the range of about 100 to 200 nm. Due to the mismatch in crystal structure or coefficient of thermal expansion (CTE) between the stress-inducing layer 322 and the sacrificial GaAs layer 320, point defects (not shown) may be generated in the GaAs layer 320. Heating, such as by rapid thermal annealing (RTA), may cause Ga to diffuse from the GaAs layer 320 into the stress inducing layer 322 leaving behind point defects such as vacancies. Heating may drive the vacancies through the upper SCH layer 318 toward the MQW 314 and induce intermixing between the quantum well and barrier layer materials. The RTA may be performed at a temperature within a range of about 600° to 1000° C. for a time within a range of about 10 sec to several minutes.

The presence of the point defects may induce intermixing in the MQW and may cause a change in the energy hole level 104 and the electron energy level 108, resulting in an increase in the distance 102' between the hole energy level 104' and the electron energy level 108' (see FIG. 1), thereby blue-shifting the gain peak, and therefore the light emitted from a VCSEL formed locally from those areas covered by the stress-inducing layer. In general, the more point defects, the greater the blue shift. The number of point defects or the extent of quantum well intermixing to provide a specific wavelength shift may be established empirically, and may depend on the design of the epitaxial layers and the properties of the cap layer 320 and stress inducing layer 322.

The step depicted in FIG. 3B may be repeated as many times as desired, to obtain a plurality of VCSELs, each emitting a different wavelength than its neighbors.

There are a number of different ways to control the concentration of point defects. For example, stress mismatch between the stress-inducing layer 322 and the sacrificial GaAs cap layer 320 may be altered in progressing across the substrate from the original, unstressed MQW region (from left to right in FIG. 3B). Increasing the stress increases the point defect concentration, which in turn causes a greater blue-shifting of the emitted light.

Alternatively, a material with a lower Ga diffusion coefficient, such as $SrF_2$, can be patterned below the $SiO_2$ layer to spatially control the concentration of point defects, and therefore, the blue shift. In this case, only a single RTA heating step is required. Another method is to pattern the $SiO_2$ layer to control the concentration of vacancies formed in the GaAs layer 320.

In another example, the composition of the stress-inducing layer 322 may be the same from one area to the next, but the thickness of the sacrificial GaAs cap layer 320 may be altered from one area to the next. In another example, the thickness of the stress-inducing layer 322 may be altered from one area to the next. The intermixing rate increases with stress-inducing layer 322 thickness.

In another example, the time of heating (e.g., RTA) may be altered, with the first capped area being at a relatively short time, say, 30 seconds, and the next capped area being at a somewhat longer time, say, 60 seconds, and so forth, or vice versa.

The stress-inducing layer 322 may be a material that is lattice mismatched or CTE (coefficient of thermal expansion) mismatched with the sacrificial layer 320, here, GaAs. Further Ga is to be able to diffuse through the material. Examples of such materials include, but are not limited to, $SiO_2$, $SiO_x$, silicon oxynitride, and $Si_xN_y$.

In yet another example, different materials may be used to control the concentration of the point defects, using materials that each cause a larger stress mismatch and, in some cases, out-diffusion of Ga in moving across the substrate (from left to right, in the Figure).

In some examples, the multiple intermixing steps may be done by repeating the following steps: 1) depositing and patterning the stress-inducing layer 322 and 2) heating the substrate. This would entail removing the layer 322 after each heating step, and depositing and patterning a new layer 322. Alternatively, in other examples, by using different materials of the stress-inducing layer 322 or altering the thickness of the sacrificial GaAs cap layer 320 or a combination of these, each region may be covered with a different set of intermixing-inducing conditions and the substrate subjected to heating at one time.

The thickness of the sacrificial GaAs layer 320 may be on the order of 10 to 100 nanometers (nm), while the thickness of the stress-inducing layer 322 may be on the order of 180 to 200 nm.

Next, as shown in FIG. 3C, the stress-inducing layer 322 and the sacrificial GaAs cap layer 320 are removed. The exposed surface of the upper SCH layer 318 is prepared for regrowth, and the upper VCSEL layers are grown. Specifically, the upper DBR 310 and heavily doped p+ GaAs contact layer (not shown) are grown. A top contact (not shown) may be formed on top of the p+ GaAs contact layer.

Figure 3D:
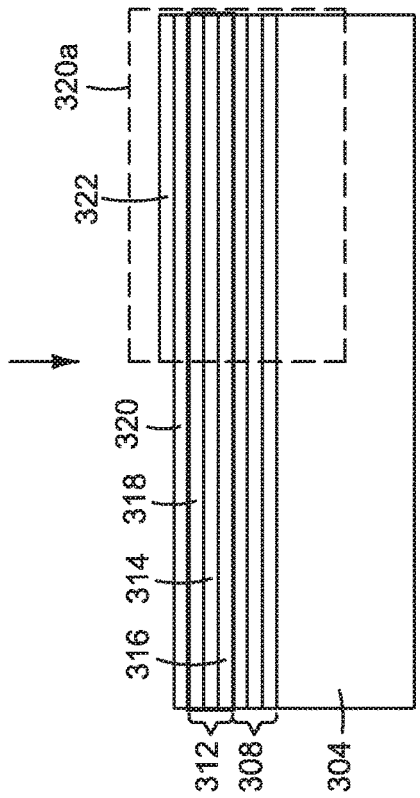

Finally, as shown in FIG. 3D, an array 300 of VCSELs 302a, 302b is formed. The individual VCSELs may be formed by etching and wet oxidation. A lower contact (not shown) may be formed on the lower DBR 308 surface.

An example of a completed VCSEL 302a, 302b may include a doped or undoped GaAs substrate 304, on which is formed a lower Bragg reflector 308 of multiple periods of n-AlGaAs/AlAs/GaAs. On the lower Bragg reflector 308 may be formed a lower SCH layer 316 of AlGaAs. On the lower SCH layer 316 may be formed a multiple quantum well layer 314, formed of alternating layers of a quantum wells of InGaAs and barriers of AlGaAs On the top of the multiple quantum well layer 314 may be formed an upper SCH layer 318 of AlGaAs. On the upper SCH layer 318 may be formed an upper Bragg reflector 310 of p-AlGaAs/AlAs/GaAs. On the upper Bragg reflector 310 may be formed a $p^+$ GaAs contact layer (not shown), on which a metal contact (not shown) may be formed.

Figure 4:
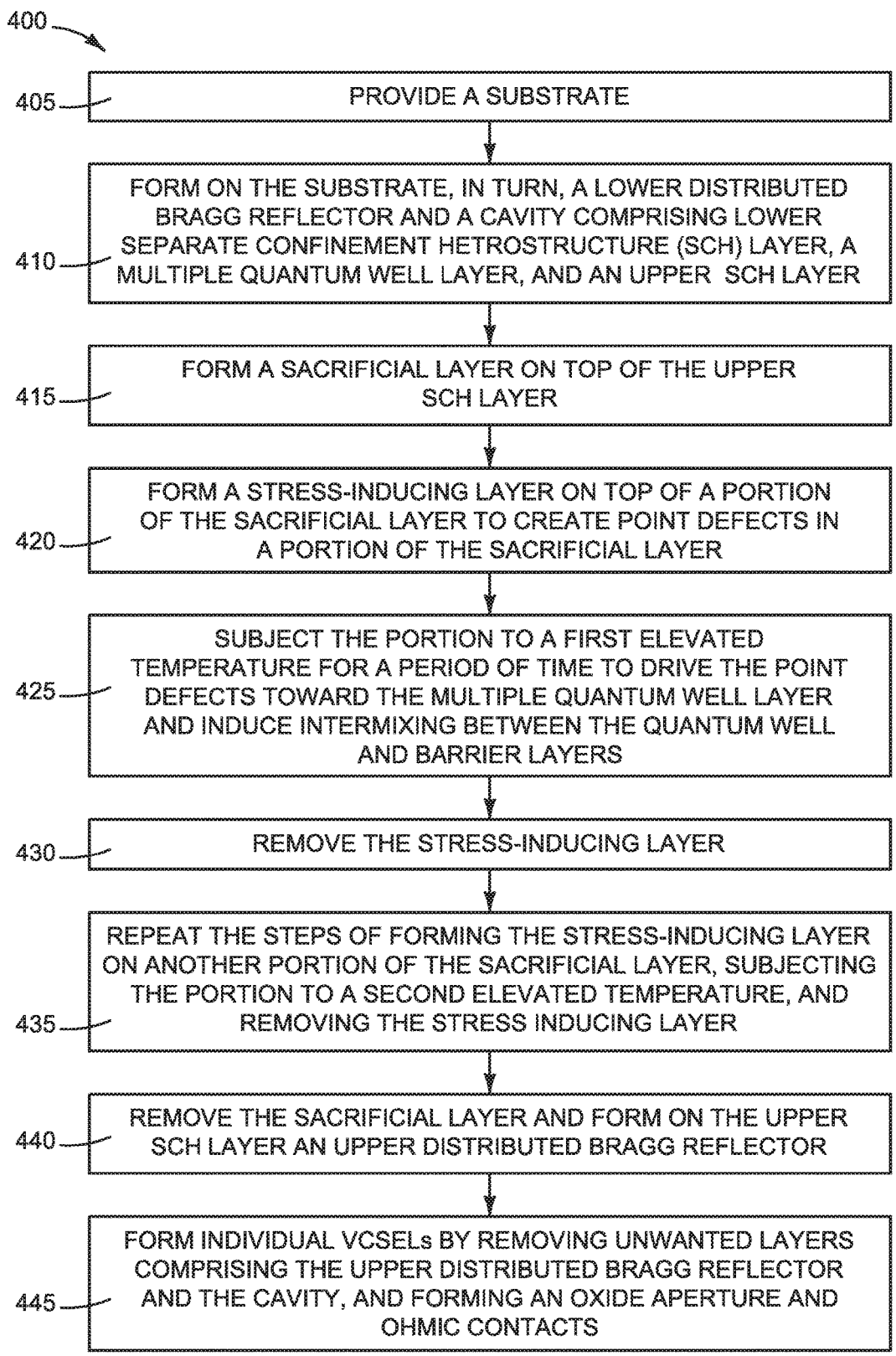
FIG. 4 is flow chart depicting the process depicted in FIGS. 3A-3D.

FIG. 4 illustrates an example process flow for FIGS. 3A-3D. The process 400 shows a method of manufacturing an array 300 of monolithic wave-length division multiplexed (WDM) vertical cavity surface emitting lasers (VCSELs) 202a-202d, 302a-302b with quantum well intermixing. The process 400 comprises providing 405 a substrate 204, 304. In some examples, the substrate may be n+ GaAs or semi-insulating GaAs.

The process 400 continues with forming 410 on the substrate 204, 304, in turn, a lower distributed Bragg reflector 208, 308, and a laser cavity 212, 312 of a lower SCH layer 216, 316, a multiple quantum well layer 214, 314, and an upper SCH layer 218, 318.

The process 400 continues with forming 415 a sacrificial layer 320 on top of the upper SCH layer 218, 318. The sacrificial layer 320 may be GaAs.

The process 400 continues with forming 420 a stress-inducing layer 322 on top of a portion 320a of the sacrificial layer 320 to create point defects in a portion of the sacrificial layer. The stress-inducing layer 322 may be $SiO_2$ or other material that induces point defects in the sacrificial layer 320.

The process 400 continues with subjecting 425 the portion 320a to a first elevated temperature for a period of time to drive the point defects toward the multiple quantum well layer 214, 314, and induce intermixing between the quantum well and barrier layers. Rapid thermal annealing may be used for this step. The RTA may be performed at a temperature within a range of about 600° to 1000° C. for a time within a range of about 10 sec to several minutes.

The process 400 continues with removing 430 the stress-inducing layer 322. The layer may be removed by dry etching or wet etching, for example.

The process 400 continues with repeating 435 the steps of forming 420 the stress-inducing layer 322 on another portion of the sacrificial layer 320, subjecting the portion to a second elevated temperature, and removing 430 the stress-inducing layer. The second elevated temperature may or may not be the same as the first elevated temperature.

The process 400 continues with removing the sacrificial layer 320 and forming 440 on the upper SCH layer 218, 318 an upper distributed Bragg reflector 210, 310.

The process 400 concludes with forming 445 individual VCSELs 202a-202d, 302a-302b by removing unwanted layers that make up the upper distributed Bragg reflector 210, 310 and the cavity 212, 312. The unwanted, layers may be removed by dry etching, for example. An oxide aperture (not shown) may be formed in the VCSELs 202a-202d, 302a-302b, such as by wet oxidation, followed by forming ohmic contacts (not shown).

Figure 5:
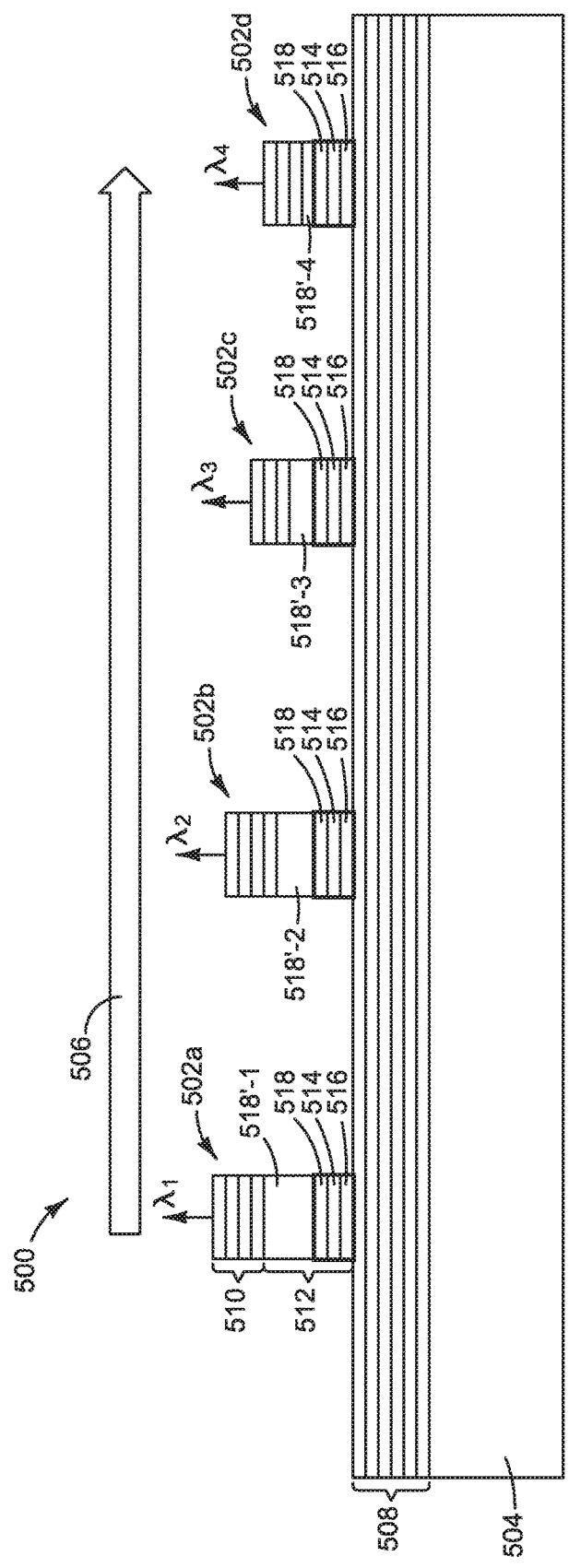
FIG. 5 is a side elevation view, depicting monolithic WDM (Wave length Division Multiplexing) VCSELs with a spatially varying gain and Fabry-Perot peak wavelength, according to an example.

FIG. 5 depicts another example of an array 50 of four VCSELs 502a, 502b, 502c, 502d, having been processed so that there is an increasing blue shift going from left to right. Each VCSEL 502a, 502b, 502c, 502d is supported on a common substrate 504 and emits a different wavelength of light $\lambda_1, \lambda_2, \lambda_3, \lambda_4$, respectively. As shown by arrow 506, the configuration 500 has a spatially increasing blue shift and decreasing cavity length. In this context, the cavity length refers to the Fabry Perot cavity formed in each VCSEL, and decreasing in length from the first VCSEL 502a to the last VCSEL 502d. The Fabry Perot cavity is described in greater detail below.

As pictured, the configuration 500 may be one-dimensional array of four VCSELs. Alternatively, the configuration 500 may be a row of four VCSELs in a two-dimensional array of VCSELs. While FIG. 5 depicts an array of four VCSELs 502a-502d, there may be fewer or more VCSELs in the array 500.

As with the array 200 depicted in FIG. 2, each VCSEL 502a-502d may include a lower distributed Bragg reflector 508 (common to all VCSELs), an upper distributed Bragg reflector 510, and a cavity 512 therebetween. The cavity 512 in each case may include a multiple quantum well (MQW) layer 514 sandwiched between a lower SCH layer 515 and an upper SCH layer 518. The lower and upper DBRs 508, 510 may be formed of alternating layers of GaAs and AlGaAs. The lower and upper confinement layers 518, 518 may be AlGaAs. The MQW 214 may be alternating layers (not shown) of, but not limited to, GaAs and AlGaAs.

The variation in wavelength progresses in an orderly fashion from the spaced-apart VCSELs. Further, this configuration 500 is called "monolithic WDM VCSELs with spatially varying gain and Fabry Perot peak wavelength". The array 500 is considered to be monolithic, since all VCSELs share the same substrate, but for the amount of intermixing in the MQW. The point defects to induce intermixing may be introduced by creating a stress mismatch on a surface of a layer above the MQW and propagating the point defects toward the MQW.

The configuration 500 is considered to be a monolithic wavelength division optical source because of the different wavelengths emitted by the array of VCSELs.

In the array 500, in some examples, each VCSEL 502a-502d may have different lengths of the upper SCH layer 518 to increase the cavity and form the Fabry Perot mirror. In other examples, a spacer layer (not shown) may be added on top of the upper SCH layer 518 as an extension. As noted earlier, the upper SCH layer 518 may be AlGaAs. If a spacer layer 518' is used, it may also be of GaAs or AlGaAs. In all cases herein of employing AlGaAs, the composition is lattice-matched to GaAs. Any of the $Al_xGa_{1-x}As$ compositions, where x ranges from 0 (GaAs) to 1 (AlAs) are lattice-matched to GaAs and may be used in the practice of these teachings. Thus, the spacer layer, if employed, could have a different Al concentration than that in the upper SCH layer 218.

FIGS. 6A-6E illustrate an example method for manufacturing an array of VCSELs. In this example, an array 600 of two VCSELs 602a, 602b is formed. It may be appreciated that more than two VCSELs may be made by this method.

Figure 6A:
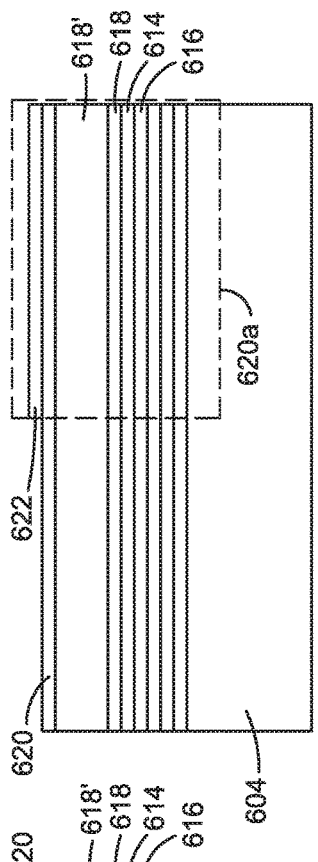
FIGS. 6A-6E depict a process flow for manufacturing the device shown in FIG. 5.

The method starts with providing a substrate 604, as shown in FIG. 6A. A lower heavily doped contact layer (not shown) may be formed on the surface of the substrate 604, followed by forming the lower DBR 608 on the contact layer. The lower SCH layer 616, the quantum wells for the MQW 614, and the upper SCH layer 618 may each be formed in turn over the lower DBR 608.

The upper SCH layer 618 itself can be grown to the thickness desired or a spacer layer 618' can be grown on top of the upper SCH layer, as discussed above, to form the Fabry Perot cavity. The Fabry Perot cavity will be thickest at the first VCSEL, since the cavity will be increasingly thinner for subsequent VCSELs. Spatial adjustment of the Fabry Perot Cavity length ensures optimum offset between the cold cavity resonant wavelength and the intermixed MQW gain peak for optimum over-temperature performance.

A sacrificial cap layer 620 may be formed over the top of the upper SCH layer 618 (or spacer layer 618'). The sacrificial cap layer 620 may be of GaAs, and may be removed in a later stage of the method.

Figure 6C:
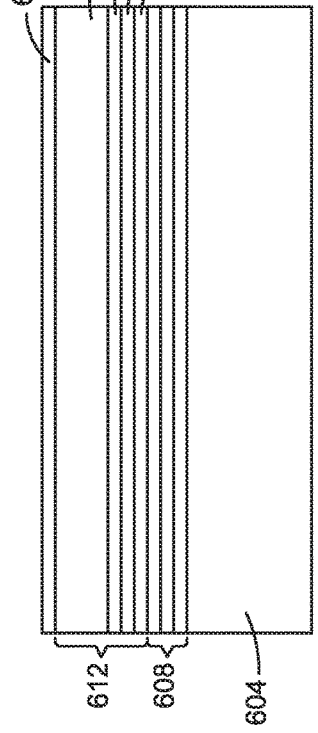
Figure 6B:
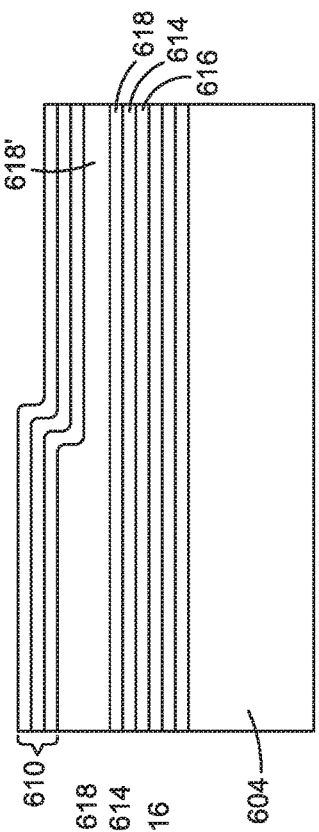

In FIG. 6B, selectively intermixing the quantum wells may be achieved by covering those areas 620a with a stress-inducing layer 622 where a blue shift is desired. Due to the mismatch in crystal structure and/or GTE between the stress-inducing layer 622 and the sacrificial GaAs layer 620, point defects (not shown) may be generated. Heating, such as by rapid thermal annealing (RTA) or laser annealing, may drive the point defects toward the MQW 614 and induce intermixing between the quantum well and barrier layers. The RTA may be performed at a temperature within a range of about 600° to 1000° C. for a time within a range of about 10 sec to several min.

The presence of the point defects may induce intermixing in the MQW and cause a change in the energy hole level 104 and the electron energy level 108, resulting in an increase in the distance 102' between the hole energy level 104 and the electron energy level 108' (see FIG. 1), thereby blue-shifting the light emitted from a VCSEL formed from those areas covered by the stress-inducing layer.

The step depicted in FIG. 6B tray be repeated as many times as desired, to obtain a plurality of VCSELs, emitting a different wavelength than its neighbors.

There are a number of different ways to control the concentration of point defects. In each case, stress mismatch between the stress-inducing layer 622 and the sacrificial GaAs cap layer 620 is altered in progressing across the substrate from the original, unstressed MQW region (from left to right in FIG. 6B). Increasing the stress increases the point defect concentration, which in turn causes a blue-shifting of the emitted light.

In one example, the composition of the stress-inducing layer 622 may be the same from one area to the next, but the thickness of the sacrificial GaAs cap layer 620 may be altered from one area to the next. In another example, the thickness of the stress-inducing layer 622 may be altered from one area to the next. As noted above, the intermixing rate increases with stress-inducing layer 622 thickness.

In another example, the time of heating (e.g., RTA) may be altered, with the first capped area being at a relatively short time, say, 30 seconds, and the next capped area being at a somewhat longer time, say, 60 seconds, and so forth, or vice versa.

The stress-inducing layer 622 may be $SiO_2$, $SiO_x$, silicon oxynitride, or $Si_xN_y$, or other material. In yet another example, different materials may be used to control the concentration of the point defects, using materials that each cause a larger stress mismatch or larger Ga diffusion coefficient in moving across the substrate (from left to right, in the Figure). An alternate method to control the concentration of point defects is to etch patterns through the stress-inducing layer to control the surface area in contact with the GaAs cap layer 620.

In some examples, the heating may be done by intermixing each region separately after applying the sacrificial GaAs layer 620 and applying and patterning the stress-inducing layer 622. This would entail removing the layer 622 after each heating and applying and patterning a new layer 622. Alternatively, in other examples, by using different materials of the stress-inducing layer 622 or altering the thickness of the stress inducing layer 622 or a combination of these, each region may be covered with a different set of stress-inducing conditions and the entire assembly subjected to heating at one time.

The thickness of the sacrificial GaAs layer 620 may be on the order of 100 nanometers (nm), while the thickness of the stress-inducing layer 622 may be on the order of 100 to 200 nm.

Next, as shown in FIG. 6C, the stress-inducing layer 622 and the sacrificial GaAs cap layer 620 are removed. The Fabry Perot cavity is reduced in length by etching in region 620a.

Figure 6D:
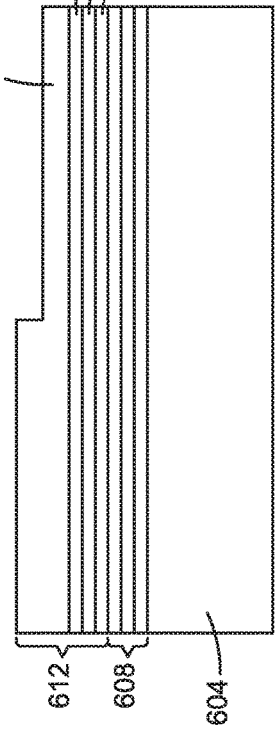

In FIG. 6D, the exposed surface of the upper SCH layer 618 is prepared for regrowth, and the upper VCSEL layers are grown. Specifically, the upper DBR 610 and heavily doped p+ GaAs contact layer (not shown) are conformally grown on layer 618'. A top contact (not shown) is formed on top of the p+ GaAs contact layer.

Figure 6E:
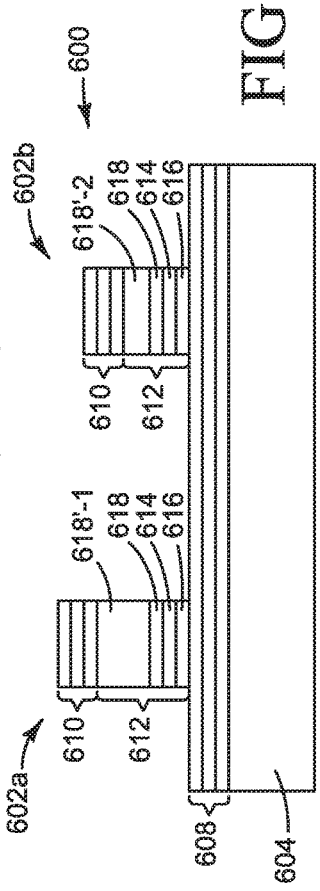

Finally, as shown in FIG. 6E, an array 602 of VCSELs 602a, 602b is formed. The individual VCSELs may be formed by dry etching and wet oxidation, followed by ohmic contact formation (not shown).

Figure 7:
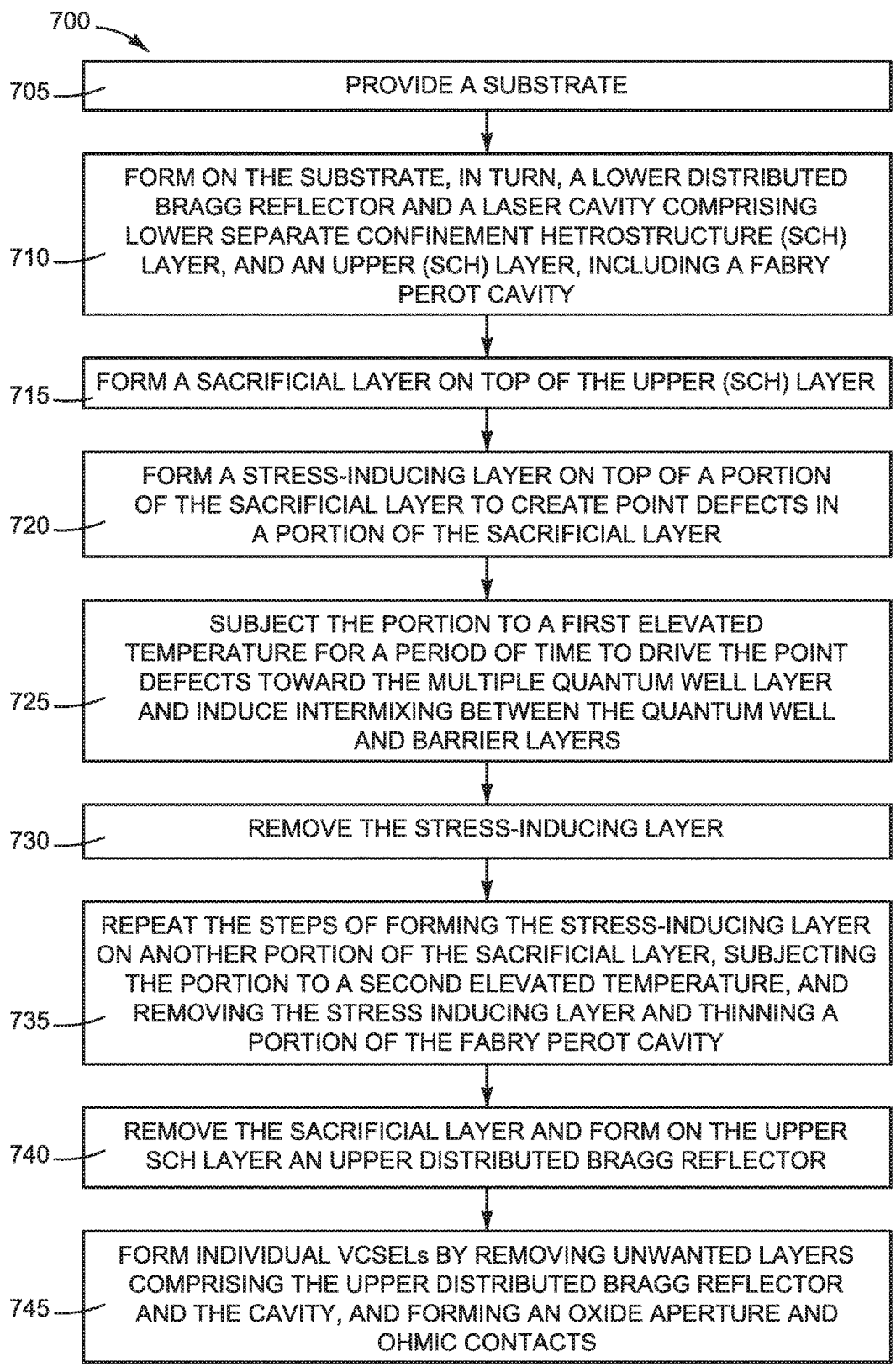
FIG. 7 is flow chart depicting the process depicted in FIGS. 6A-6E.

FIG. 7 illustrates an example process flow for FIGS. 6A-6E. The process 700 shows a method of manufacturing an array 600 of monolithic wavelength division multiplexed (WDM) vertical cavity surface emitting lasers (VCSELs) 502a-502d, 602a-602b with quantum well intermixing. The process 700 includes providing 705 a substrate 504, 604. In some examples, the substrate may be GaAs.

The process 700 continues with forming 710 on the substrate 504, 604, in turn, a lower distributed Bragg reflector 508, 608, and a cavity 512, 612 of a lower SCH layer 516, 616, a multiple quantum well layer 514, 614, and an upper SCH layer 518, 618. A Fabry Perot cavity length tuning layer is created either by growing a relatively thick upper SCH layer 516, 616 or adding a lattice-matched layer to the upper confinement layer. The longest Fabry Perot cavity layer 518'-1 may have a length on the order of 100 nm, while the shortest Fabry Perot cavity layer 518'-4 may have a length on the order of 10 nm, with the intermediate Fabry-Perot cavity layers 518'-2 and 518'-3 having lengths within this range.

The process 700 continues with forming 715 a sacrificial layer 620 on top of the upper SCH layer 518, 618.

The process 700 continues with forming 720 a stress-inducing layer 622 on top of a portion 620a of the sacrificial layer 620 to create point defects in a portion of the sacrificial layer.

The process 700 continues with subjecting 725 the portion 720a to a first elevated temperature for a period of time to drive the point defects toward the multiple quantum well layer 514, 614 and induce the quantum well and barrier materials to intermix.

The process 700 continues with removing 730 the stress-inducing layer 622.

The process 700 continues with repeating 735 the steps of forming 715 the stress-inducing layer 622 on another portion of the sacrificial layer, subjecting the portion to a second elevated temperature, which may or may not be the same as the first elevated temperature, removing 730 the stress-inducing layer 622. The Fabry Perot tuning layer thickness is thinned. Each successive thinning operation results in a thinner cavity layer in the direction of the blue shift in wavelength.

The process 700 continues with forming 740 on the upper SCH layer 518, 618 an upper distributed Bragg reflector 510, 610.

The process 700 concludes with forming 745 individual VCSELs 502a-502d, 602a-602b by removing unwanted layers that make up the upper distributed Bragg reflector 510, 610 and the cavity 512, 612. The unwanted layers may be removed by dry etching, for example. An oxide aperture (not shown), such as by wet oxidation, and ohmic contacts may be formed in the VCSELs 502a-502d, 602a-602b.

Figure 8:
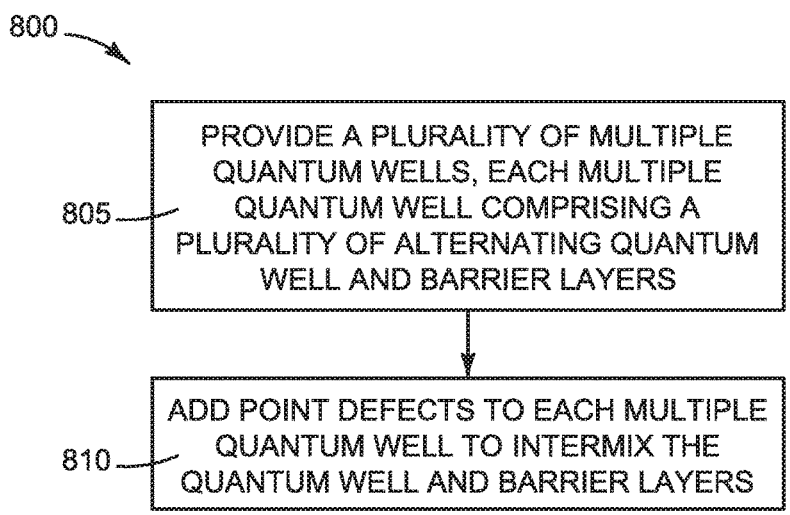
FIG. 8 is a flow chart depicting a more general process for manufacturing an array of monolithic wavelength division multiplexed (WDM) vertical cavity surface emitting lasers (VCSELs) with quantum well intermixing.

FIG. 8 depicts a more general process 800 for manufacturing an array of monolithic wavelength division multiplexed (WDM) vertical cavity surface emitting lasers (VCSELs) with quantum well intermixing. As described above, each VCSEL includes a multiple quantum well and emits light at a different wavelength from the others.

In the process 800, a plurality of multiple quantum wells are provided 805. Point defects may be added 810 to induce intermixing between the quantum well and barrier layers. Different concentrations of point defects may induce different amounts of intermixing and different wavelengths of light.

Intermixing in the multiple quantum well may be achieved by:

forming a stress-inducing layer on top of a portion of a sacrificial layer to create point defects in a portion of the sacrificial layer; and subjecting the portion to an elevated temperature for a period of time to drive the point defects toward the multiple quantum well layer and induce intermixing of the quantum well and barrier layer materials.

The use of quantum well intermixing in the manufacture of VCSEL arrays may reduce the packaging cost and complexity of VCSEL-based WDM transmitters.

What is claimed is:

1. An array of monolithic wavelength division multiplexed (WDM) vertical cavity surface emitting lasers (VCSELs) with quantum well intermixing, each VCSEL including a bottom distributed Bragg reflector (DBR), an upper distributed Bragg reflector, and a laser cavity therebetween, wherein the laser cavity includes a multiple quantum well (MQW) layer sandwiched between a lower separate confinement heterostructure (SCH) layer and an upper SCH layer, each MQW layer experiencing a different amount of quantum well intermixing and concomitantly a different lasing wavelength shift.

2. The array of claim 1, in which the lower and upper DBRs comprise layers of GaAs and AlGaAs, the lower and upper SCH layers comprise AlGaAs, and the MQW comprises layers of InGaAs or GaAs, and AlGaAs or InGaP or GaAsP.

3. The array of claim 1, in which the VCSELs are arranged in a linear fashion, each VCSEL having more quantum well intermixing in a particular direction, each VCSEL emitting light of a wavelength that is blue-shifted in the direction of more quantum well intermixing.

4. The array of claim 3, in which the concentration of point defects arises from stress mismatch, with a greater number of point defects resulting in a larger quantum well intermixing.

5. An array of monolithic wavelength division multiplexed (WDM) vertical cavity surface emitting lasers (VCSELs) with quantum well intermixing, each VCSEL including a bottom distributed Bragg reflector (DBR), a upper distributed Bragg reflector, and a laser cavity therebetween, wherein the laser cavity may include a multiple quantum well (MQW) layer sandwiched between a lower separate confinement heterostructure (SCH) layer, and an upper SCH layer, each MQW experiencing a different amount of quantum well intermixing and concomitantly a different wavelength shift,
  wherein each VCSEL further includes a Fabry Perot cavity tuning layer as part of the laser cavity, the Fabry Perot cavity tuning layer having a length that varies from one VCSEL to another.

6. The array of claim 5, in which the lower and upper DBRs comprise layers of GaAs and AlGaAs, the lower and upper SCH layers comprise AlGaAs, and the MQW comprises layers of GaAs or InGaAs, and AlGaAs or InGaP or GaAsP.

7. The array of claim 5, in which the VCSELs are arranged in a linear fashion, each VCSEL having a larger quantum well intermixing in a particular direction, each VCSEL emitting light of a wavelength that is blue-shifted in the direction of larger quantum well intermixing.

8. The array of claim 7, in which the concentration of point defects arises from stress mismatch, with a greater number of point defects resulting in a larger quantum well intermixing.

9. The array of claim 5, in which the Fabry Perot cavity tuning layer comprises part or all of the upper SCH layer.

10. A method of manufacturing an array of monolithic wavelength division multiplexed (WDM) vertical cavity surface emitting lasers (VCSELs) with quantum well intermixing, each VCSEL including a multiple quantum well and emitting light at a different wavelength from the others, each quantum well comprising a plurality of alternating quantum well and barrier layers, the method including:
  providing a plurality of the multiple quantum wells; and
  adding point defects to each multiple quantum well to intermix the quantum well and barrier layers,
wherein different concentrations of point defects induce different amounts of intermixing in the multiple quantum well and different wavelengths of light.

11. The method of claim 10, wherein the point defects are created by:
  forming a stress-inducing layer on top of a portion of a sacrificial layer to create point defects in a portion of the sacrificial layer; and
  subjecting the portion to an elevated temperature for a period of time to drive the point defects toward the multiple quantum well layer.

12. The method of claim 10, comprising:
  providing a substrate;
  forming on the substrate, in turn, a lower distributed Bragg reflector and a cavity comprising lower separate confinement heterostructure (SCH) layer, the multiple quantum well layer, and an upper SCH layer;
  forming a sacrificial layer on top of the upper SCH layer;
  forming a stress-inducing layer on top of a portion or the sacrificial layer to create point defects in a portion of the sacrificial layer;
  subjecting the portion to a first elevated temperature for a period of time to drive the point defects toward the multiple quantum well layer to induce quantum well intermixing;
  removing the stress-inducing layer;
  repeating the steps of forming the stress-inducing layer on another portion of the sacrificial layer, subjecting the portion to a second elevated temperature, which may or may not be the same as the first elevated temperature, and removing the stress-inducing layer and the sacrificial layer;
  forming on the upper SCH layer an upper distributed Bragg reflector; and
  forming individual VCSELs by removing unwanted layers comprising the upper distributed Bragg reflector and the cavity, and forming an oxide aperture an ohmic contacts.

13. The method of claim 12, in which the point defects are driven toward the multiple quantum well layer by rapid thermal annealing.

14. The method of claim 10, in which a Fabry Perot cavity tuning layer is formed with the upper SCH layer, and comprises part or all of the upper SCH layer, wherein the Fabry Perot cavity tuning layer has length that varies from one VCSEL to another.

15. The method of claim 14, comprising:
  providing a substrate;
  forming on the substrate, in turn, a lower distributed Bragg reflector and a cavity comprising lower SCH layer, the multiple quantum well layer, and an upper SCH layer with the Fabry Perot cavity tuning layer;
  forming a sacrificial layer on top of the upper SCH layer;
  forming a stress-inducing layer on top of a portion of the sacrificial layer to create point defects in a portion of the sacrificial layer;
  subjecting the portion to a first elevated temperature for a period of time to drive the point defects toward the multiple quantum well layer to induce quantum well intermixing;
  removing the tress-inducing layer;
  repeating the steps of forming the stress-inducing layer on another portion of the sacrificial layer, subjecting the portion to a second elevated temperature, which may or may not be the same as the first elevated temperature, thinning a portion of the Fabry Perot cavity and removing the stress-inducing layer and the sacrificial layer;
  forming on the upper SCH layer an upper distributed Bragg reflector; and
  forming individual VCSELs by removing unwanted layers comprising the upper distributed Bragg reflector and the cavity, and forming an oxide aperture and ohmic contacts.

* * * * *